United States Patent [19]
Davis et al.

[11] Patent Number: 5,436,183
[45] Date of Patent: Jul. 25, 1995

[54] ELECTROSTATIC DISCHARGE PROTECTION TRANSISTOR ELEMENT FABRICATION PROCESS

[75] Inventors: Jeffrey B. Davis, Raymond; Stephen C. Park, Scarborough, both of Me.

[73] Assignee: National Semiconductor Corporation, Santa Clara, Calif.

[21] Appl. No.: 122,120

[22] Filed: Sep. 16, 1993

Related U.S. Application Data

[60] Continuation-in-part of Ser. No. 713,027, Jun. 7, 1991, abandoned, which is a division of Ser. No. 510,277, Apr. 17, 1990, abandoned.

[51] Int. Cl.$^6$ .................. H01L 21/72; H01L 29/784; H01L 27/04
[52] U.S. Cl. ......................... 437/40; 437/51; 257/360
[58] Field of Search ............ 437/40, 51, 56, 57; 257/355, 356, 360

[56] References Cited

U.S. PATENT DOCUMENTS

| | | | |
|---|---|---|---|
| 3,676,742 | 7/1972 | Russell et al. | 357/23.13 |
| 3,819,952 | 6/1974 | Enomoto et al. | 357/23.13 |
| 4,551,779 | 11/1985 | Murakami et al. | 257/360 |
| 4,605,980 | 12/1986 | Hartranft et al. | 257/360 |
| 4,616,243 | 10/1986 | Minato et al. | 357/23.13 |
| 4,727,405 | 2/1988 | Misu | 357/23.13 |
| 4,807,080 | 2/1989 | Clark | 357/23.13 |
| 4,893,157 | 1/1990 | Miyazawa et al. | 257/360 |
| 5,027,252 | 6/1991 | Yamamura | 257/360 |
| 5,051,860 | 9/1991 | Lee et al. | 257/360 |
| 5,141,898 | 8/1992 | Lapham | 437/238 |
| 5,158,899 | 10/1992 | Yamagata | 437/51 |
| 5,166,089 | 11/1992 | Chen et al. | 437/39 |

FOREIGN PATENT DOCUMENTS

| | | | |
|---|---|---|---|
| 0057024 | 8/1982 | European Pat. Off. | |
| 54-136278 | 10/1979 | Japan | 357/23.13 |
| 54-137286 | 10/1979 | Japan | 357/23.13 |
| 56-090555 | 7/1981 | Japan | 357/23.13 |
| 59-224164 | 12/1984 | Japan | 357/23.13 |
| 63-104477 | 5/1988 | Japan | 357/23.13 |

*Primary Examiner*—Mary Wilczewski
*Attorney, Agent, or Firm*—Daniel H. Kane; Stephen R. Robinson; Vincenzo D. Pitruzzella

[57] ABSTRACT

An electrostatic discharge protection (ESDP) transistor element is coupled at an input or output of an MOS integrated circuit (IC) device for protecting internal transistor elements of the MOS IC device from electrostatic discharge (ESD) dielectric breakdown voltages. A relatively thick passivating layer of low temperature deposited passivating material is deposited over the active area between the channel and gate of the ESDP transistor element. A metal layer gate is formed over the passivating layer. The channel insulating layer thickness provides a turn on voltage $V_{TON}$ less than the dielectric breakdown voltage BVGOX of internal transistor elements. The bond pads of the MOS IC device are used for the metal layer gates and the metal layer gate bond pads are formed over the active area of the ESDP transistor elements. The ESDP transistor elements are fabricated using the same mask sequence and associated mask steps as the internal transistor elements of the MOS IC device, modified to provide a thick oxide MOS (TOXMOS) metal gate ESDP transistor element.

18 Claims, 5 Drawing Sheets

ELECTROSTATIC DISCHARGE PROTECTION TRANSISTOR ELEMENT FABRICATION PROCESS

This application is a continuation-in-part of application Ser. No. 07/713,027, filed Jun. 7, 1991, now abandoned, which is a division of application Ser. No. 510,277 filed Apr. 17, 1990, also abandoned.

TECHNICAL FIELD

This invention relates to a new electrostatic discharge protection (ESDP) transistor element for protecting internal transistor elements of an MOS integrated circuit (IC) device from electrostatic discharge (ESD) dielectric breakdown voltages. The ESDP transistor element is coupled at an input or output of the MOS IC device for diverting ESD charge buildup before occurrence of dielectric breakdown voltages at the internal transistor elements. The invention also provides a process for fabricating MOS IC devices incorporating the ESDP transistor elements preferably under the bond pads of the MOS IC device. The ESDP transistor elements are fabricated without extra steps during the same mask sequence and associated mask steps as the internal transistor elements of the MOS IC device.

BACKGROUND ART

Dielectric breakdown of internal input and output MOS transistor elements is a significant factor in the failure of MOS IC devices. An input 10 for such a device is illustrated in the fragmentary circuit diagram of FIG. 1 where the gate G of an internal input NMOS transistor element is connected by a metal conductor to the bond pad 12 for coupling to external circuitry. The gate G of the NMOS transistor element is insulated from the drain D, channel C and source S regions of the NMOS transistor element by a thin gate oxide (GOX) layer 14 of thermally grown silicon dioxide $SiO_2$. The channel C between drain D and source S merges with the P Well or bulk B of the NMOS transistor element which is typically coupled with source S to ground potential GND. The thin GOX layer 14 is typically grown to a depth or thickness of for example 225 Å–400 Å (angstrom units). The thin GOX layer 14 can withstand a voltage stress across the gate G and channel C of only up to for example approximately 15 volts without dielectric breakdown and failure of the transistor element and MOS IC device.

Figure 1:
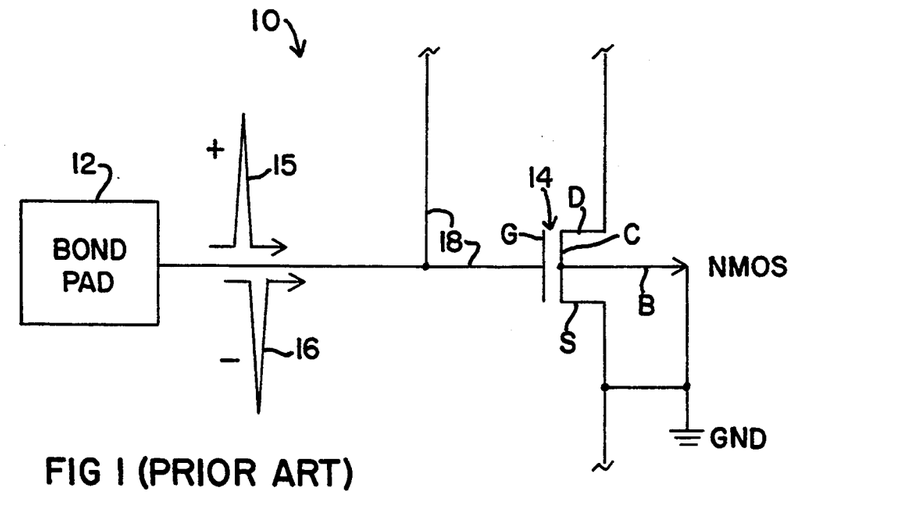
FIG. 1 is a fragmentary schematic circuit diagram of an input and input bond pad of an MOS IC device vulnerable to ESD transient voltages.

During handling of the MOS IC device, the bond pad 12 coupled to the outside world may receive electrostatic discharges (ESD) causing positive and negative transient voltage spikes 15, 16 on the input conductor. The charge buildup on the bond pad and transient voltage spikes, which may be as great, for example, as 10,000 volts, are fed to the gate G of internal MOSFET's including the illustrated NMOS transistor element and other PMOS and NMOS transistor elements coupled to the input line 18.

It is apparent that in order to prevent failure, ESD voltage spikes greater than or equal to the gate oxide layer breakdown voltage BVGOX of approximately 15 volts must be avoided, or diverted, or cancelled. Generally, a voltage greater than 10 to 15 volts across the GOX layer 14 should always be prevented. An early solution for preventing ESD spike voltages greater than 15 volts from reaching the MOSFET gates was to divert the voltage spikes through spark gap discharge to pointed metal discharge paths positioned along the input line and coupled to ground. The pointed aluminum metal discharge paths provide graduated spark gap discharge voltage breakdown paths less than the dielectric breakdown voltage BVGOX of the internal transistor gate oxide layers. This expedient is no longer permitted because of the electromagnetic interference (EMI) and radio frequency interference (RFI) caused by pointed metal spark gap discharge.

Figure 2:
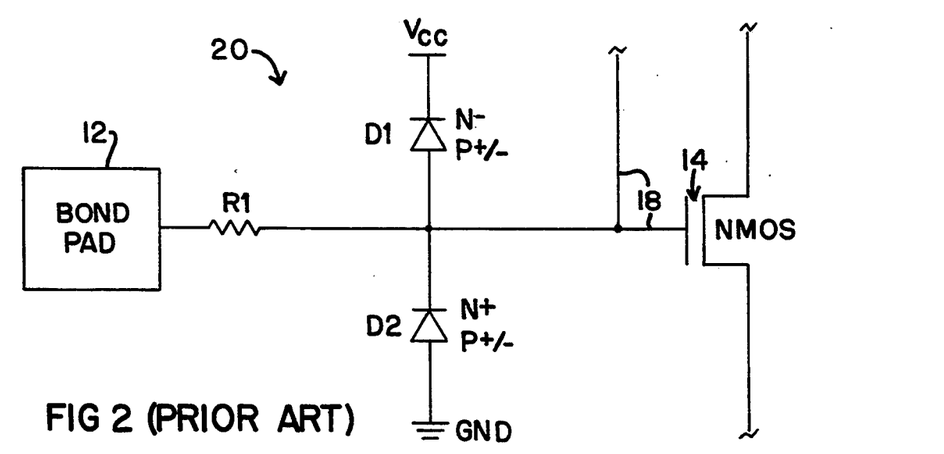
FIG. 2 is a fragmentary schematic circuit diagram of an input and input bond pad of an MOS IC device protected by prior art ESDP diode clamping.

ESD protection is currently provided by clamping the input or output line using ESDP diodes as illustrated in the input circuit 20 of FIG. 2. The ESDP diodes D1 and D2 are arranged to prevent over stress of GOX layers 14 from electrostatic charge voltages. Positive voltage spikes instead of building up voltage across the MOSFET gate and channel, discharge to the high potential voltage source $V_{cc}$ through the conduction path provided by clamping diode D1. ESDP diode D1 is typically a P+ to N− junction. For example an ESD voltage spike of +15 v causes current flow in the direction from cathode to anode of diode D1 to the lower +5 voltage source $V_{cc}$. Negative voltage spikes for example of −15 v to −20 v cause current to flow from ground in the cathode to anode direction of diode D2 cancelling the voltage buildup. In each example electron flow is in the opposite direction to current flow.

As shown in FIG. 2 a current limiting resistor R1 may be added in series with the ESDP diodes D1 and D2 to slow down charge buildup. A disadvantage of the conventional arrangement of FIG. 2 is that the current limiting resistor R1 in combination with the capacitor junctions of the diode elements D1 and D2 results in an RC time constant delay in biasing the diodes to start conducting and diverting or cancelling electrostatic charge buildup. Since the duration of the transient ESD may be in nanoseconds, the dielectric breakdown voltage BVGOX at the input MOS transistor gates may be exceeded before the conducting paths through diodes D1 and D2 are fully established.

Another disadvantage of the conventional diode clamping ESDP arrangement of FIG. 2 occurs during "power down" applications of the MOS IC device. In power down applications, the voltage source $V_{cc}$ node is reduced from 5 volts to 0 volts to conserve energy, reduce heat, etc. Power down is typically used in battery powered applications such as lap top computers and modular systems with separately controlled modules on the mother board. While ESDP diode clamp D1 may provide satisfactory operation with the $V_{cc}$ node at 5 v, a problem is encountered with the $V_{cc}$ node at 0 v while the data circuit input remains connected with the power off.

The P+/N− junction of the clamping diode D1 provides a direct path to the silicon substrate of a P well MOS IC device for positive voltages appearing at the input bond pad. Each time the input goes high from a data signal coupled to the input, a charge is pumped into the substrate which acts as a large capacitance for storage of the positive charge. This phenomenon of input "wiggling" eventually builds up sufficient voltage in the substrate to act as a positive power supply battery powering up the MOS IC device and turning it back on.

A possible solution to the problem of "wiggling" encountered in power down applications, is to remove the $V_{cc}$ conduction path diode D1 and accompanying P+/N− path to substrate. However, removal of diode D1 leaves no protection against positive going ESD voltage spikes. A further expedient is therefore required for diverting, dissipating and protecting against positive electrostatic discharge. It would be desirable that any added ESD protection without the P+/N− $V_{cc}$ diode be incorporated in the MOS IC device without added steps during the fabrication process.

The process for fabrication of the internal transistor elements of the MOS IC device is illustrated in FIGS. 3–7. The wafer fabrication process generally follows the following mask sequence and associated mask steps.

Figure 3:
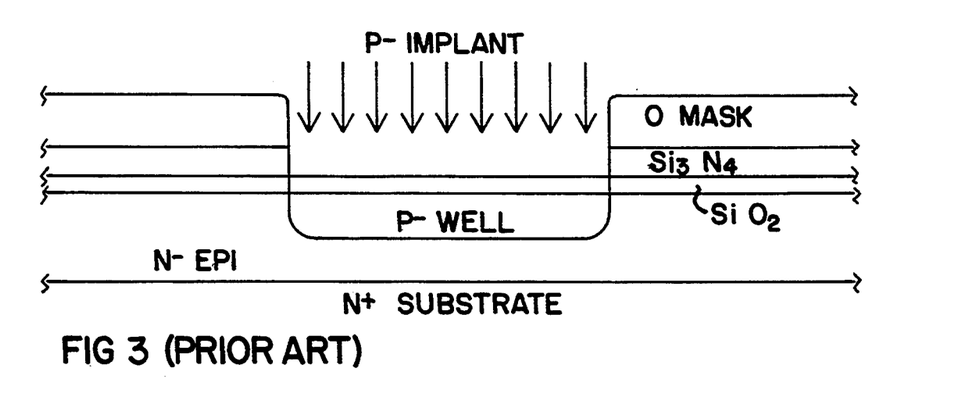
FIGS. 3–7 are fragmentary simplified diagrammatic cross sections through an MOS IC device illustrating the prior art steps for fabrication of internal MOS transistor elements.

0 P Well Definition Mask
1.0 Active Area Definition Mask
2.0 P Well Field Implant Mask
3.0 Poly Definition Mask (Gate Definition Mask For Internal Transistors)
4.0 N+ Source/Drain Implant Mask (Self-Aligned Internal NMOS Transistor Mask)
4.1 P+ Source/Drain Implant Mask (Self-Aligned Internal PMOS Transistor Mask)
5.0 Contact Definition Mask
6.0 Metal 1 (M1) Definition Mask
7.0 VIA Mask (Second Contact Definition Mask)
8.0 Metal 2 (M2) Definition Mask
9.0 Passivation Definition Mask As illustrated in FIG. 3 the fabrication process begins with a substrate of N+ silicon semiconductor material prepared with an N− silicon epitaxial layer and thin protective layers of thermally grown silicon dioxide $SiO_2$ and silicon nitride $Si_3N_4$. The oxide layer is typically 400 Å and the nitride layer 1600 Å. A photoresist layer is "spun on" and patterned to provide the 0 Mask or P Well Definition Mask defining the P− wells for NMOS transistor elements. The nitride layer is stripped in a dry etch over the P− well area and P− wells are established by a P− boron ion implant. As used herein the plus and minus superscripts indicate the relative concentration of N type or P type dopant material in the silicon semiconductor material and the relative conductivity of the silicon regions.

Figure 4:
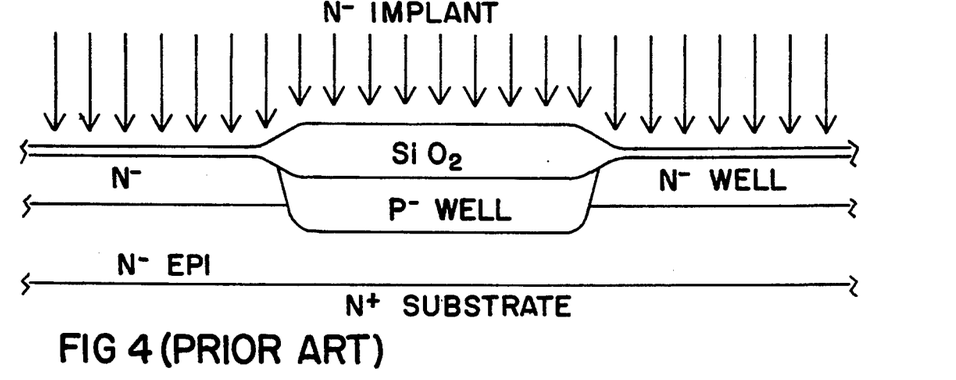
Figure 5:
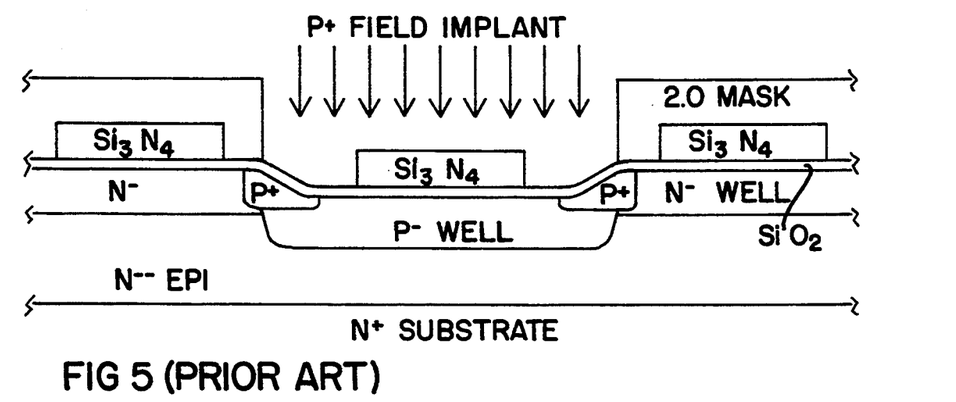

In subsequent steps the P− implant ions are thermally driven into the P− well and a relatively thick oxide layer is thermally grown over the P− well to act as a barrier to the subsequent N− implant. The remaining portions of the nitride layer are stripped in a wet etch. An N− implant of N type dopant material ions such as phosphorus ions establishes the N− wells for PMOS transistor elements outside the P− well areas as shown in FIG. 4.

The silicon dioxide layer grown over the P− well is stripped in a wet etch and a new thin oxide layer is grown to a depth of 400 Å across the chip. An N well drive step drives the implanted N type phosphorus dopant material deeper into the N− wells and enhances the epitaxial layer.

A new nitride layer is deposited to a thickness of 1600 Å across the chip and the nitride layer is patterned and etched using the photoresist 1.0 Active Area Definition Mask, not illustrated. The active area definition mask and etch step leaves islands of silicon nitride over the P− wells and N− wells coinciding with the active areas for NMOS and PMOS transistor elements respectively. The wells are thus wider or larger in area than the active areas of the respective transistor elements which are limited to the areas of the silicon nitride islands illustrated in FIG. 5. The 1.0 Mask and resulting nitride island define the channel width of the NMOS & PMOS transistor elements.

The photoresist 2.0 P Well Field Implant Mask is next formed covering the N− wells followed by the P+ field implants. The 2.0 P Well Field Implant Mask, also referred to as the N Channel Field Implant Mask, is similar to the 0 P Well Definition Mask but leaves openings slightly larger for example 2μ outside the original P− well areas. The P+ field implant establishes P+ channel stop regions to increase the threshold voltage or turn on voltage $V_{TON}$ of parasitic transistor structures that arise between active areas across the field oxide hereafter described. The P+ field implant is a boron ion implant on all sides of the nitride island rectangle coinciding with the active area of the NMOS transistor elements to be fabricated in the P− wells.

Following the P+ field implant and stripping of the 2.0 Mask the field oxide regions are grown between the nitride islands, surrounding the nitride islands for isolating the active areas. The field oxide or FOX is grown to a thickness of, for example, 6000 Å. The nitride islands prevent growth of FOX in the active areas of the NMOS and PMOS transistor elements. The nitride islands are then stripped from the chip. A blanket boron implant is used to adjust the carrier concentration and turn on voltage $V_{TON}$ of the active areas, and then the thin oxide layer is removed.

A thin gate oxide layer GOX of approximately 225 Å is grown over the active areas. A blanket layer of polycrystalline silicon (poly) is then deposited to a depth of for example 3500 Å across the chip and the surface of the poly layer is oxidized to form a thin protective polyoxide layer.

Figure 6:
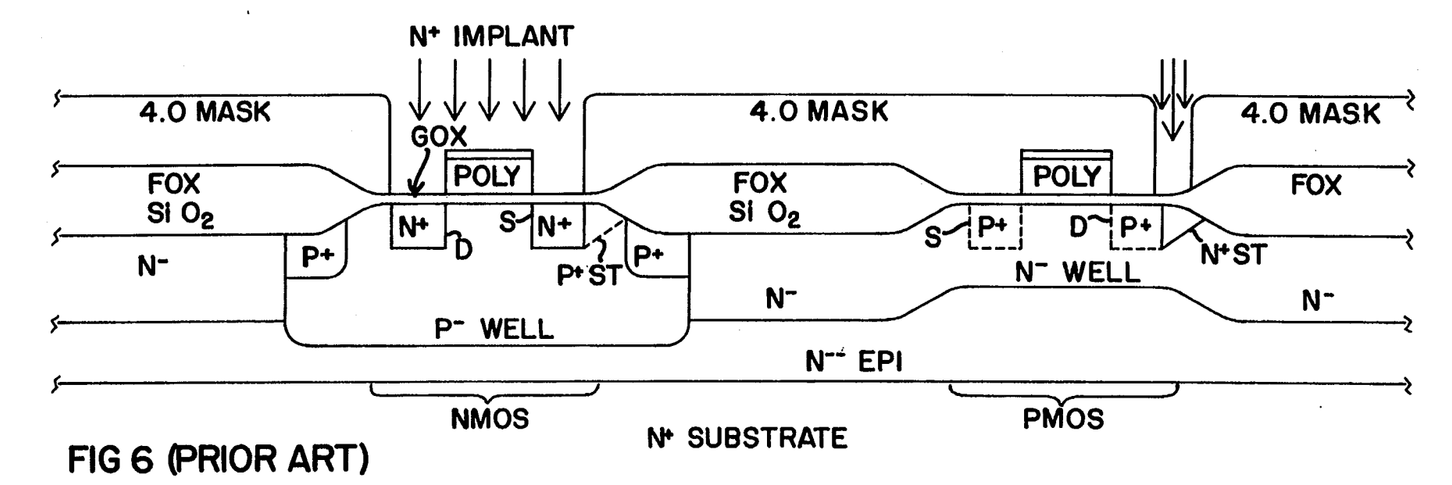

The poly layer is then patterned using the 3.0 Poly Definition Mask, not illustrated, and the poly definition mask and etch steps leave gates of polysilicon over the active areas as illustrated in FIG. 6. In FIG. 6, a poly gate is shown over the P− well for an NMOS transistor element and over the N− well for a PMOS transistor element. The poly gates are smaller than the active areas of the respective transistor elements and define the channel length of the respective transistor elements. The photoresist 3.0 Poly Definition Mask also functions as the gate definition mask for internal transistor elements.

The poly gates for the NMOS transistor elements over the P− wells in combination with the photoresist 4.0 N+ Source/Drain Implant Mask provide a self-aligned transistor mask for the internal NMOS transistor elements. An N+ implant follows establishing the N+ drain and source regions for the NMOS transistor elements as illustrated in FIG. 6. The photoresist 4.0 Mask opens a small area over the N− well also for an N+ substrate tie N+ST for N− well substrate ties.

The photoresist 4.1 P+ Source/Drain Implant Mask not illustrated is similar to the 4.0 mask of FIG. 6 but covers the P− wells and active areas for the NMOS transistor elements. The N− wells and active areas of the PMOS transistor elements are exposed for P+ implant of the P+ source and drain regions of the PMOS transistor elements. Similarly a small opening is provided over the P− well to establish P+ substrate ties P+ST for P− well substrate ties. In effect the 4.1 Mask and associated 4.1 Mask steps are the inverse of the 4.0 Mask and associated 4.0 Mask steps.

The 4.0 Mask N+ implant of N type dopant material ions may be accomplished in two steps, first implanting heavier arsenic ions followed by implanting lighter phosphorus ions which diffuse faster and deepen the N+ region. A graded concentration profile can therefore be established. Upon completion of implant of the source and drain regions, the photoresist 4.0 and 4.1

Masks are stripped and a blanket passivating layer of for example, low temperature semiconductor material oxide (LTO) is deposited to a depth typically in the range of 5000 Å to 6500 Å. The LTO or other passivating material may be deposited by chemical vapor deposition to a depth of, for example, 6.3K Å. The blanket passivating layer is patterned and etched using the photoresist 5.0 Contact Definition Mask, not illustrated, for defining and establishing the openings in the LTO or other passivating material layer for metal contacts from the Metal 1 layer hereafter described.

Figure 7:
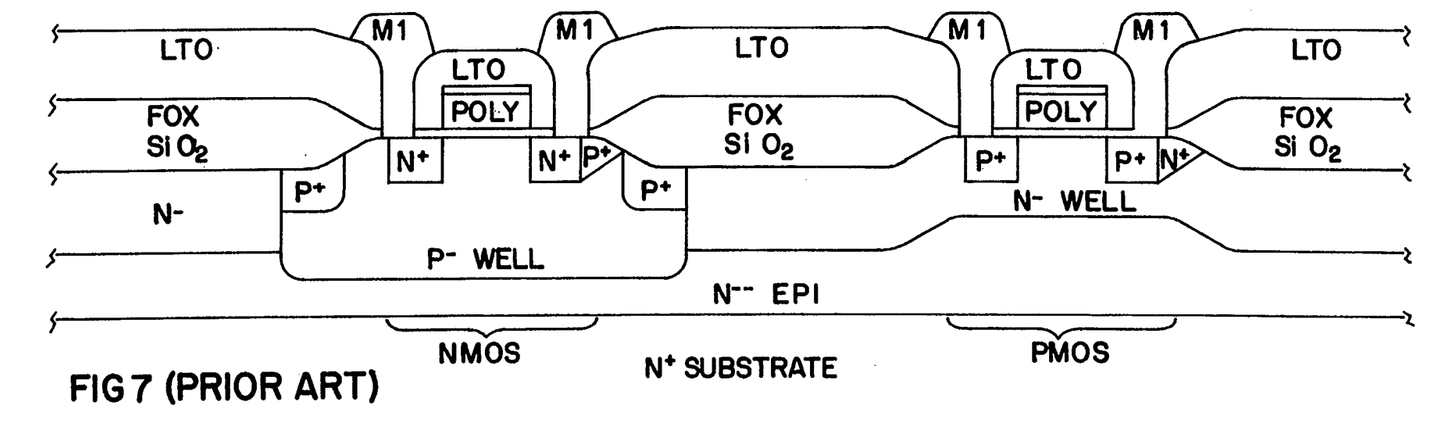

For the internal transistor elements, the LTO layer provides an insulating passivating layer over the poly gate and between the poly gate and M1 layer as illustrated in FIG. 7. The 5.0 Contact Definition Mask defines the metal conductor contacts to the source and drain regions. The first metal layer is deposited over the patterned passivating layer and the Metal 1 layer is masked and etched using the 6.0 M1 Definition Mask leaving the source and drain metal contacts and conductors. The M1 layer also provides the first layer for bond pads of the MOS IC device.

A second LTO layer or other interlayer dielectric (ILD) material layer is deposited, masked and etched using the 7.0 VIA Mask which defines openings for contacts between the Metal 2 layer and Metal 1 layer including the openings for bond pads. The 7.0 VIA Mask is a second contact definition mask for the second LTO or ILD layer. The second metal layer is deposited, masked and etched using the photoresist 8.0 M2 Definition Mask. The second metal layer M2 in parallel with the first metal layer M1 reduces current density etc. It also provides the second metal layer for the bond pads. The bond pads are formed of composite or merged portions of layers M1 and M2. The final steps include depositing a passivating nitride layer over, the entire chip followed by the photoresist 9.0 Passivation Definition Mask and etch steps for opening the bond pads.

OBJECTS OF THE INVENTION

It is therefore an object of the present invention to provide a new thick oxide transistor element for electrostatic discharge protection at the inputs and outputs of MOS IC devices, with a threshold voltage $V_{TON}$ or turn on voltage less than the gate oxide dielectric breakdown voltage BVGOX of the internal transistor elements. For example the ESDP transistor element should have a turn on voltage $V_{TON}$ in the order of 7 v to 10 v in order to divert, cancel and dissipate electrostatic discharges at the input or output of the MOS IC device without buildup of dielectric breakdown voltages.

Another object of the invention is to provide ESDP transistor elements which are fabricated during the same mask sequence and associated mask sequence steps as the internal transistor elements of the MOS IC device. The fabrication process for MOS IC devices incorporating the ESDP transistor elements requires no additional steps. n particular, it is an object to form ESDP transistor elements with metal gates and a relatively thick channel insulating or gate insulating layer formed entirely by depositing and using the passivating layer of internal transistor elements without any additional step such as thermally growing the channel insulating or gate insulating layer. Thus the deposited passivating layer is intended to form the entire gate insulating layer of the ESDP transistor elements.

A further object of the invention is to provide ESDP transistor elements for ESD protection at the bond pads of MOS IC devices without using additional space on the chip by forming the bond pads over the ESDP transistor elements.

DISCLOSURE OF THE INVENTION

In order to accomplish these results the present invention provides an electrostatic discharge protection (ESDP) transistor element coupled at an input or output of an MOS IC device for protecting internal transistor elements of the MOS IC device from ESD dielectric breakdown voltages. The ESDP transistor element is formed in an active area with source and drain regions of first type semiconductor material in a well of second type semiconductor material forming a channel between the source and drain regions. According to the invention a channel insulating thick oxide layer of passivating material such as LTO is deposited over the active area forming a channel insulating layer between the channel and gate of the ESDP transistor element. A metal layer gate is formed over the passivating layer resulting in a metal gate thick oxide transistor element.

A feature of the invention is that the passivating insulating layer thickness deposited over the active area provides for the ESDP transistor element a turn on voltage $V_{TON}$ less than the dielectric breakdown voltage of internal transistor elements of the MOS IC device. Electrostatic charge buildup at an input or output is therefore diverted before occurrence of dielectric breakdown voltages at the internal transistor elements. Furthermore, the deposited gate insulating layer forms the entire gate insulating or channel insulating layer without any additional steps and without thermally growing any portion of the gate insulating or channel insulating layer.

In the preferred example embodiment the inputs and outputs of the MOS IC device are coupled to bond pads and the metal layer gate of the ESDP transistor element is a bond pad of the MOS IC device. The bond pad is therefore formed over the ESDP transistor element without requiring extra space on the integrated circuit chip. The invention thus provides a novel metal gate transistor element in which the metal gate is a bond pad of an IC device and the transistor element is formed under the bond pad.

One of the source and drain regions of the ESDP transistor element is electrically coupled to the metal layer gate and this common coupling is in turn coupled to an input or output of the MOS IC device. The other of the source and drain regions is coupled to ground. In the preferred example the ESDP transistor element is an NMOS transistor element having N+ source and drain regions in a P− well. The metal layer gate is therefore coupled to the N+ drain region and the N+ source region is coupled to ground.

An advantage of this arrangement is that positive going ESD voltage spikes are diverted to ground through the ESDP transistor element. As a result a P+/N− junction ESDP diode conduction path to $V_{cc}$ is not required and is eliminated from the MOS IC device. The MOS IC device is therefore operative for use in powered down applications.

Typically the MOS IC device is fabricated with a plurality of ESDP transistor elements, each bond pad of the MOS IC device being formed over one of the ESDP transistor elements and providing the metal gate of the metal gate ESPD. All P+/N− junction ESDP diodes formerly coupled between respective inputs or outputs and a high potential source $V^{cc}$, are eliminated. ESDP transistor elements are NMOS ESDP transistor elements for diverting positive going ESD spikes. The drain region and gate of each NMOS ESDP transistor element are coupled together at the input or output and the source region is coupled to ground.

Such MOS IC devices typically include a plurality of internal MOS transistor elements fabricated in active areas of a semiconductor material substrate separated by field oxide regions. Each internal MOS transistor element is formed with a gate of polycrystalline semiconductor material (poly) and a channel insulated from the poly gate by a relatively thin thermally grown semiconductor material gate oxide layer (GOX). A passivating layer of passivating material such as low temperature semiconductor material oxide (LTO) is deposited over the poly gates and active areas of the internal transistor elements. A first metal layer of metal conductors is formed over the LTO with metal contacts through the passivating LTO to the source and drain regions. The inputs and outputs of the MOS IC device are coupled to bond pads for coupling in turn to external circuitry.

The ESDP transistor elements coupled at the inputs and outputs of the MOS IC device are preferably formed with a channel insulating passivating layer between the channel and gate of the ESDP transistor element using the passivating LTO layer of the internal transistor elements for the channel insulating LTO layer of the ESDP transistor elements. The gate insulating passivating layer deposited over the active area of the ESDP transistor elements forms the entire gate insulating layer without thermally growing a gate insulating layer and without any additional steps. Metal layer gates are formed over the LTO channel insulating layer using at least the first metal layer of the internal transistor elements for the metal gates of the ESDP transistor elements.

The process for fabricating an MOS IC device incorporating the ESDP transistor elements according to the invention uses the same sequence of masks and associated mask steps used for forming the internal MOS transistor elements. This mask sequence includes a Poly Definition Mask, Source/Drain Implant Mask, Contact Definition Mask, and Metal 1 (M1) Layer Definition Mask. The process also incorporates the associated mask steps used in fabricating the internal transistor elements including the steps of blanket deposition of a layer of poly before the poly definition mask steps, blanket deposition of a LTO layer before the contact definition mask steps, and blanket deposition of a conductive Metal 1 layer before the M1 Definition Mask steps.

In forming the internal transistor elements, the Poly Definition Mask provides the gate definition mask defining poly gates for internal transistor elements. The Source/Drain Implant Mask provides a self-aligned transistor mask for implanting source and drain regions of the internal transistor elements. The Contact Definition Mask steps provide an insulating passivating layer between the poly gate and Metal 1 layer. And, the M1 Definition Mask provides conductor lines and contacts to the source and drain regions of the internal transistor elements.

According to the invention the ESDP transistor elements incorporated at the inputs and outputs of the MOS IC device are fabricated during the same mask sequence and mask sequence steps modified as follows but without requiring any additional steps.

The poly definition mask is constructed and arranged to cause etching across the active area of the ESDP transistor elements. The fabrication process proceeds by etching away and eliminating the poly layer in the active area of the ESDP transistor elements. The source/drain implant mask is constructed and arranged to provide a non-self-aligned transistor mask over the active area of the ESDP transistor elements. The process proceeds by implanting source and drain regions separated by a channel through the non-self-aligned transistor mask.

The process further proceeds by depositing the passivating layer over the active area of the ESDP transistor elements without any intervening poly layer. The passivating layer of LTO or other passivating material therefore forms a channel insulating layer over the active area of the ESDP transistor element. The M1 definition mask is constructed and arranged for forming in addition to the metal conductors and contacts, metal gates-over the channels of the respective ESDP transistor elements separated and insulated by the LTO layer. According to the invention the M1 definition mask therefore provides the gate definition mask during fabrication of the ESDP transistor element. The metal gates coincide with the bond pads in the preferred embodiment.

Other objects, features and advantages of the invention are apparent in the following specification and accompanying drawings.

DESCRIPTION OF PREFERRED EXAMPLE EMBODIMENTS AND BEST MODE OF THE INVENTION

Figure 8:
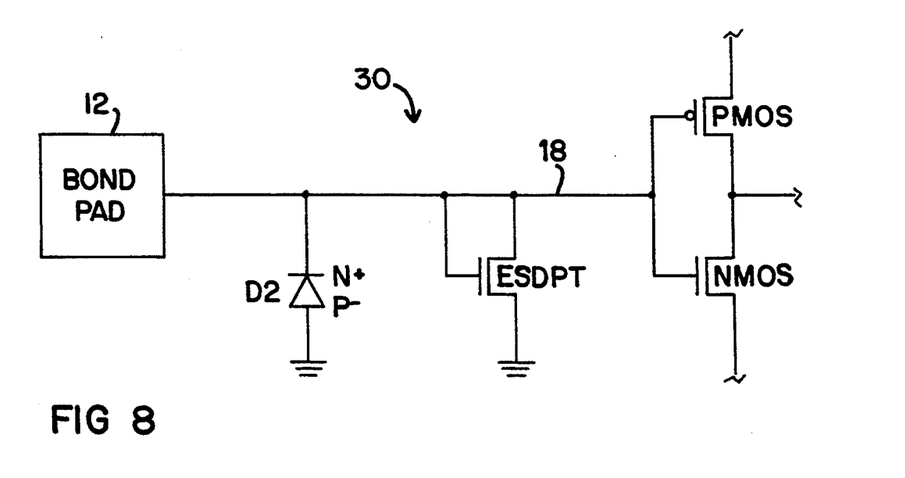
FIG. 8 is a fragmentary schematic circuit diagram at an input and input bond pad of an MOS IC device with ESD protection using an ESDP transistor element (ESDPT) according to the invention.

ESD protection according to the invention at the input of an MOS IC device is illustrated in the fragmentary circuit diagram of FIG. 8. As there shown, the clamping diode D1 affording a conduction path to the high voltage source $V^{cc}$ and a P+/N− junction path to the substrate has been eliminated. In order to provide protection from positive going ESD voltage spikes at the input, the invention provides instead an electrostatic discharge protection transistor element ESDPT coupled between the input and ground potential. The ESDP transistor element according to the invention is a relatively thick oxide MOS transistor element (TOXMOS transistor element) with a metal gate and a relatively low turn on voltage $V_{TON}$. The relatively "thick oxide" refers to the thick channel insulating passivating layer deposited over the active area of the ESDP transistor element. The passivating layer is typically an oxide of silicon such as LTO or other semiconductor material deposited by low temperature chemical vapor deposition to a thickness of for example 5,000 Å to 6,500 Å at typically 6.3K Å. This deposited passivating layer forms the entire gate insulating or channel insulating layer of the ESDP transistor element without thermally growing any portion of the gate insulating or channel insulating layer and without requiring any additional steps beyond the steps otherwise used in fabricating the internal transistor elements of the MOS IC device.

The thickness of the LTO layer and the low surface barrier potential of the metal gate combine to give a relatively low threshold voltage or low $V_{TON}$ for the ESDPT of for example in the range of 7 v–10 v. Typically in the preferred embodiment, with an LTO layer 6.3K Å thick and an aluminum metal gate, the $V_{TON}$ is 7.2 v. The turn on voltage of the ESDP thick oxide MOS transistor element according to the invention is therefore substantially less than the $V_{TON}$ of a FOXMOS transistor element which is typically in the range of 20 v–27 v.

The ESDP transistor element is an NMOS transistor element for diverting, dissipating and cancelling positive going ESD spikes. Therefore the gate and drain terminals are tied together at the input while the source is tied to ground potential. Positive voltage spikes are therefore diverted to ground.

Figure 9:
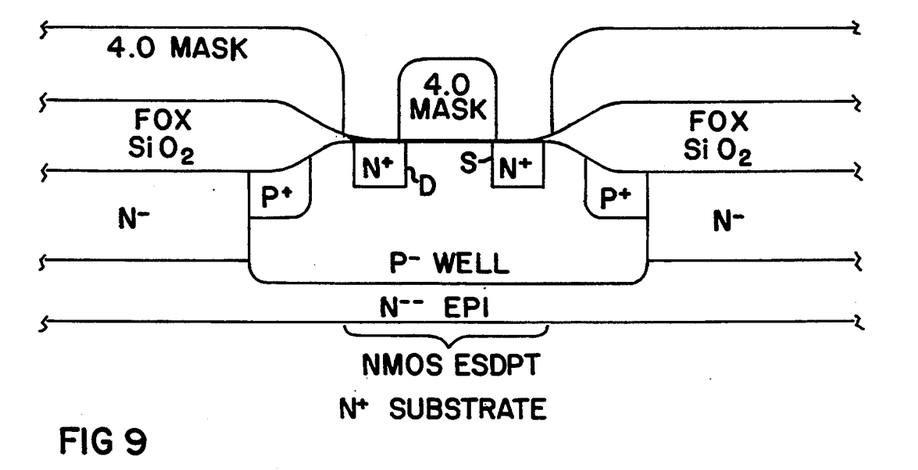
FIGS. 9 and 11 are fragmentary simplified diagrammatic side cross sections and FIG. 10 a fragmentary simplified plan view of an MOS IC device showing the modification of mask sequence steps for fabrication of ESDP transistor elements according to the invention during the same mask sequence and associated mask sequence steps used in fabrication of the internal transistor elements.
Figure 10:
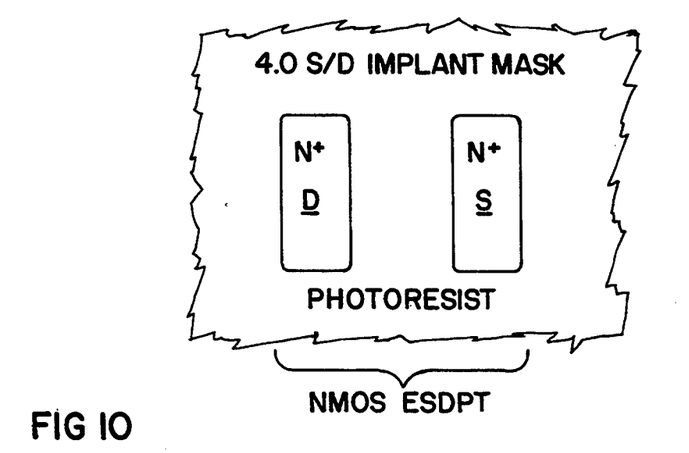

The ESDP TOXMOS transistor element is fabricated according to the same mask sequence and associated mask sequence steps that are used in fabricating the internal MOS transistor elements with the modifications for forming the ESDP transistor elements as illustrated in FIGS. 9–12. As illustrated in FIG. 9 in contrast with FIG. 6, it is apparent that the 3.0 Poly Definition Mask is modified over the active area of the ESDP transistor element to etch away the poly layer across the entire active area. As a result the poly gate is eliminated from the active area of the ESDP transistor element as shown in FIG. 9.

The 4.0 N+ source/drain implant mask is therefore also modified to provide a non-self-aligned ESDP transistor mask for implanting the source and drain regions. The non-self-aligned photoresist 4.0 Mask is further illustrated in FIGS. 9 & 10. A non-self-aligned 4.1 Mask would also be used for implanting P+ source and drain regions for a PMOS ESDP transistor element.

The mask sequence and associated mask sequence steps continue with deposition of the passivating low temperature oxide layer. In the active area of the ESDP transistor element where the poly layer has been etched away, this passivating layer is formed directly over the P− well to become the channel insulating layer. The LTO layer is masked and etched using the 5.0 Contact Definition Mask.

Figure 11:
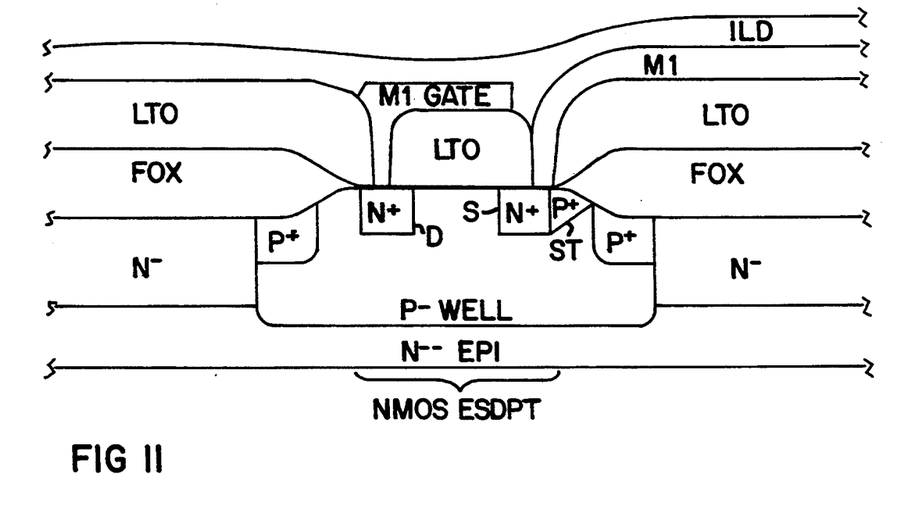

The 6.0 Metal 1 Definition Mask defines in addition to the conductors and connectors, the first layer of a metal gate. The metal gate is formed on the passivating layer over the channel of the NMOS ESDPT as illustrated in FIG. 11. The 6.0 M1 Definition Mask is constructed and arranged to define an M1 gate layer which also overlaps the N+ drain and source regions of the NMOS ESDPT. To this end the photoresist center spacer of the 4.0 Mask in the active area of the NMOS ESDP transistor element as illustrated in FIG. 9, is slightly smaller in length than the M1 gate shown in FIG. 11 and defined by the 6.0 Mask. The M1 gate layer in fact forms the first layer of a bond pad as hereafter more fully described.

The channel width of the ESDPT is previously defined by the 1.0 Active Area Definition Mask as is the case for the internal transistor elements. The 1.0 Active Area Definition Mask is previously modified over the active area of the ESDP transistor element to provide a desired channel width which may be substantially greater than the internal transistor elements and for example approximately 800μ.

Figure 12:
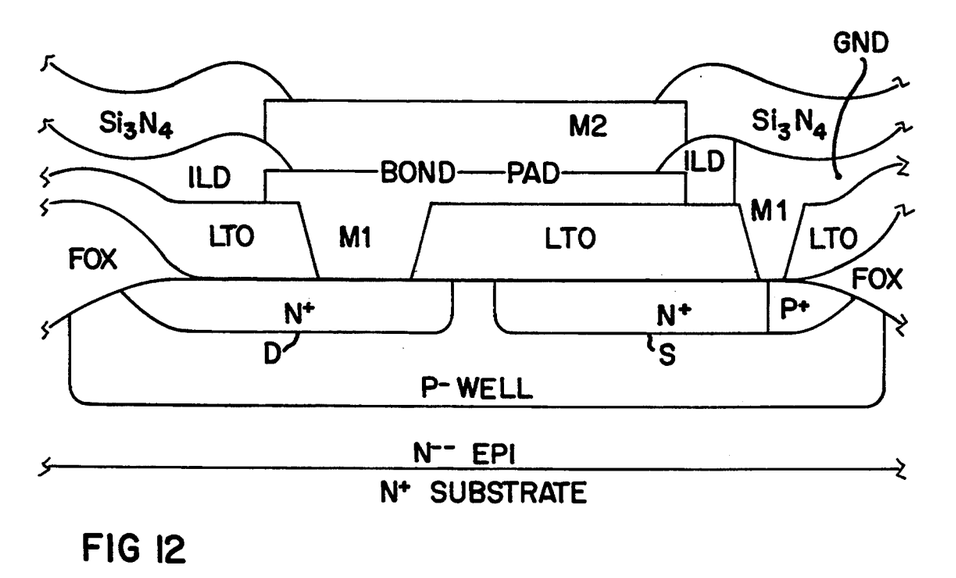
FIG. 12 is a fragmentary simplified diagrammatic cross section of an MOS IC device showing an ESDP transistor element according to the invention.

Another passivating dielectric layer is deposited over the defined Metal 1 layer, and is referred to as the interlayer dielectric ILD shown in FIG. 11. The NMOS ESDPT is then completed as illustrated in FIG. 12. The ILD layer may be for example, another LTO layer and is masked and etched using the 7.0 VIA Mask which functions as a second contact definition mask for defining contacts between the first and second metal layers. The Metal 2 (M2) layer is deposited followed by the 8.0 M2 Definition Mask steps. The 8.0 M2 Definition Mask defines the second layer of the metal gate which is also a bond pad of the MOS IC device as illustrated in FIG. 12. A final protective and passivating nitride layer is deposited over the structure and the 9.0 Passivation Definition Mask is used to define the bond pad openings.

Figure 13:
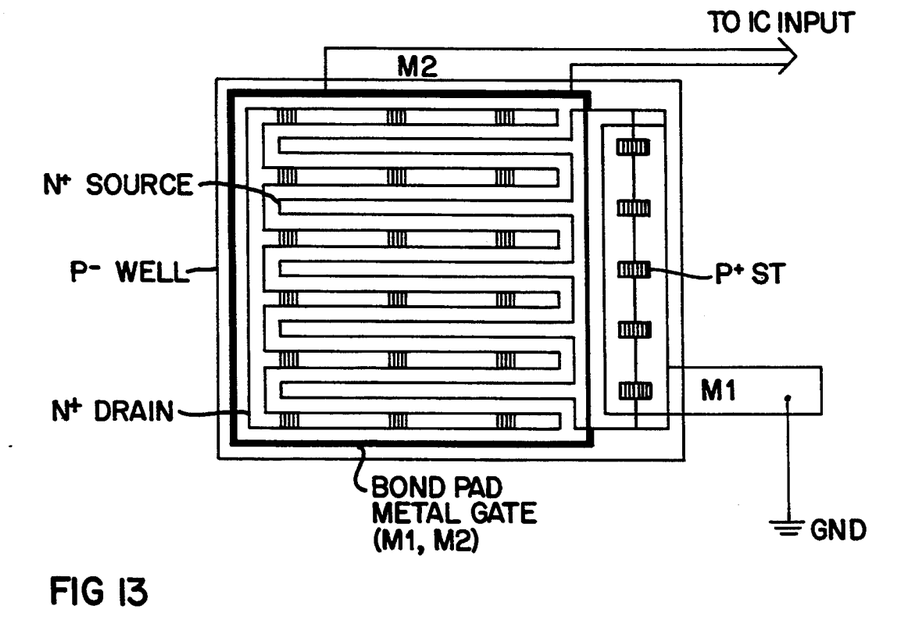
FIG. 13 is a simplified diagrammatic plan view with a cut-away through the bond pad showing the layout of an ESDP transistor element according to the invention under the bond pad of an MOS IC device.

A plan view of the NMOS ESDPT showing the layout of a distributed transistor element below the bond pad is illustrated in FIG. 13. Each of the elements of the NMOS ESDPT are indicated by the same reference designations including the P− well, N+ source, N+ drain, P+ substrate tap P+ ST, and bond pad. Only the outline of the bond pad is shown so that the layout of the distributed transistor element is visible below the bond pad. A conductor formed from the M2 layer provides the coupling between the bond pad and input while a conductor from the M1 layer provides a coupling between the source region and ground, and a coupling between the N+ drain region and gate.

While the bond pad overlies the ESDP transistor element in the preferred embodiment, the ESDPT may also be located elsewhere. If not positioned under the bond pad, then the M1 and M2 metal layer definition masks are constructed to define a separate metal gate over the channel of the ESDPT separated by the channel insulating passivating layer. A metal conductor line is also defined coupling the gate and drain region to the input or bond pad.

The illustrated example embodiment is an NMOS ESPD transistor element for protection from positive going ESD voltage spikes. However PMOS ESDP transistor elements may similarly be constructed using the same mask sequence and associated mask step modifications selected for PMOS construction applicable for example for protection from negative going ESD voltage spikes.

While the invention has been described with reference to these particular example embodiments it is intended to cover all modifications and equivalents within the scope of the following claims.

We claim:

1. A process for fabricating an MOS integrated circuit (IC) device having internal MOS transistor elements fabricated in active areas of a semiconductor material substrate separated by field oxide regions using a sequence of masks and associated mask steps including a poly definition mask, source/drain implant mask, contact definition mask, and metal 1 layer (M1) definition mask, said process of fabricating the internal transistor elements including steps of blanket deposition of a layer of polycrystalline semiconductor material before the poly definition mask steps, blanket deposition of a passivating layer of passivating oxide material before the contact definition mask steps, and blanket deposition of a conductive metal 1 layer before the M1 definition mask steps, said poly definition mask providing the gate definition mask for internal transistor elements defining polycrystalline semiconductor material gates, said source/drain implant mask providing a self aligned transistor mask for implanting source and drain regions of the internal transistor elements, said contact definition mask steps providing an insulating passivating layer between the polycrystalline semiconductor material gate and metal 1 layer for internal transistor elements, and said M1 definition mask providing conductor lines to the source and drain regions of internal transistor elements, said IC device having inputs and outputs with respective input and output bond pads for coupling to external circuitry, said process comprising:

fabricating at least one electrostatic discharge protection (ESDP) transistor element coupled to an input or output of the MOS IC device and having the primary current path of the ESDP transistor element coupled between the input or output and ground, for diverting electrostatic charge buildup at a bond pad away from internal transistor elements to prevent dielectric breakdown of internal transistor elements, and fabricating said ESDP transistor element in an active area of the semiconductor material substrate during the same mask sequence and mask sequence steps of the internal transistor elements without requiring additional steps, said same mask sequence steps being modified as follows for each ESDP transistor element;

constructing the poly definition mask to cause etching across the active area of the ESDP transistor element and etching away and eliminating the polycrystalline semiconductor material layer in the active area of the ESDP transistor element;

constructing the source/drain implant mask to provide a non-self-aligned transistor mask over the active area of the ESDP transistor element and introducing source and drain regions separated by a channel through the non-self-aligned transistor mask;

depositing the passivating layer as a relatively thick oxide layer over the active area of the ESDP transistor element without any intervening polycrystalline semiconductor material layer, said relatively thick oxide layer forming a relatively thick channel insulating passivating layer deposited over the active area between the channel and gate of the ESDP transistor element, said deposited passivating layer being formed with a thickness selected to give a relatively low threshold voltage for the ESDP transistor element less than the breakdown voltage of the internal MOS transistors of the MOS IC device, and without thermally growing a gate insulating layer or channel insulating layer for the ESDP transistor element, said passivating layer forming the entire gate insulating layer or channel insulating layer over the active area of the ESDP transistor element;

and constructing and using said M1 definition mask for forming a metal gate over the channel of the respective ESDP transistor element insulated by the passivating layer, said M1 definition mask providing the gate definition mask for the ESDP transistor element.

2. The process for fabricating an MOS IC device set of claim 1 wherein the step of constructing and using the M1 definition mask to form a metal gate over the channel of the ESDP transistor element comprises using a bond pad for the metal gate and forming the bond pad over the respective ESDP transistor element.

3. The process for fabricating an MOS IC device of claim 2 wherein said ESDP transistor element is an NMOS ESDP transistor element, and constructing and using the M1 definition mask to form a contact between the metal gate bond pad and drain region of the NMOS ESDP transistor element and for coupling the source region to ground.

4. The process for fabricating an MOS IC device of claim 1 comprising depositing the relatively thick channel insulating passivating layer for the ESDP transistor element to a thickness in the range of approximately 5,000 Å to 6,500 Å.

5. The process for fabricating an MOS IC device of claim 4 comprising the additional step of providing a threshold voltage for the ESDP transistor element in the range of approximately 7 v–10 v.

6. The process for fabricating an MOS IC device of claim 1 comprising depositing the relatively thick channel insulating passivating layer to provide a threshold voltage for the ESDP transistor element in the range of approximately 7 v–10 v.

7. A process for fabricating an MOS integrated circuit (IC) device having internal MOS transistor elements fabricated in active areas of a semiconductor material substrate separated by field oxide regions using substantially the following sequence of masks and associated mask steps:

0 P Well Definition Mask
1.0 Active Area Definition Mask
2.0 P Well Field Introduction Mask
3.0 Poly Definition Mask Providing Gate Definition Mask For Internal Transistors
4.0 N+ Source/Drain Introduction Mask Providing Self-Aligned Internal NMOS Transistor Mask
4.1 P− Source/Drain Introduction Mask Providing Self-Aligned Internal PMOS Transistor Mask
5.0 Contact Definition Mask
6.0 Metal 1 (M1) Definition Mask said process including steps of blanket deposition of a layer of polycrystalline semiconductor material between mask steps 2.0 and 3.0, blanket deposition of a passivating layer of low temperature deposited passivating material between mask steps 4.0/4.1 and 5.0, and blanket deposition of conductive metal layer M1 between mask steps 5.0 and 6.0, said 3.0 Poly Definition Mask providing the gate definition mask for internal transistor elements defining polycrystalline semiconductor material gates, said 4.0 N+ Source/Drain Implant Mask providing a self aligned transistor mask for internal NMOS transistor elements for introduction around the polycrystalline semiconductor material gate of underlying source and drain regions separated by a channel, said passivating layer and 5.0 Contact Definition Mask providing an insulating passivating layer between the polycrystalline semiconductor material gate and M1 layer for internal transistor elements, and said M1 Definition Mask providing conductor lines to the source and drain regions of internal transistor elements, said MOS IC device having inputs and outputs with respective input and output bond pads for coupling to external circuitry, said process comprising:

fabricating a plurality of electrostatic discharge protection (ESDP) transistor elements coupled to respective inputs and outputs of the MOS IC device and having respective primary current paths coupled between a respective input or output and ground, for diverting electrostatic charge buildup at the bond pads away from internal transistor elements to prevent dielectric breakdown of internal transistor elements, and fabricating said ESDP transistor elements in active areas of the semiconductor material substrate during the same mask sequence and mask sequence steps as used for the internal transistor elements without requiring additional steps, said same mask sequence steps being modified as follows for the ESDP transistor elements;

constructing and using the 3.0 Poly Definition Mask to provide an opening across the active areas of ESDP transistor elements, and etching away and eliminating the polycrystalline semiconductor material layer in the active areas of the ESDP transistor elements;

constructing and using the 4.0 N+ Source/Drain Implant Mask to provide a non-self-aligned transistor mask over the active areas of the ESDP transistor elements and introducing source and drain regions through the non-self-aligned transistor masks;

depositing the passivating layer as a relatively thick oxide layer over the active areas of the ESDP transistor elements without any intervening polycrystalline semiconductor material layer, said relatively thick oxide layer forming a relatively thick channel insulating passivating layer deposited over the active area between the channel and gate of the ESDP transistor element, said deposited passivating layer being formed with a thickness selected to give a relatively low threshold voltage for the ESDP transistor element less than the breakdown voltage of internal MOS transistors of the MOS IC device, and without thermally growing a gate insulating layer or channel insulating layer for the ESDP transistor element, said passivating layer forming the entire gate insulating layer or channel insulating layer over the active areas of the ESDP transistor elements;

and constructing and using said 6.0 M1 Definition Mask to form metal gates from the Metal 1 layer over the channel regions of the ESDP transistor elements insulated from the respective ESDP transistor element channels by the passivating layer and using the bond pads of the MOS IC device for the metal gates, said 6.0 M1 Definition Mask providing the gate definition mask for the ESDP transistor elements.

8. The process of claim 7 comprising the steps of depositing the relatively thick channel insulating passivating layer for the ESDP transistor element to a thickness in the range of approximately 5,000 Å to 6,500 Å.

9. The process of claim 8 comprising the further step of providing a threshold voltage for the ESDP transistor in the range of approximately 7 v–10 v.

10. The process of claim 7 comprising the steps of constructing and using the M1 definition mask to form a metal contact between the bond pad metal gate and drain region of each NMOS ESDP transistor element, and electrically coupling the source region of each NMOS ESDP transistor element to ground.

11. The process of claim 7 comprising the step of depositing the relatively thick channel insulating passivating layer to provide a threshold voltage for the ESDP transistor element in the range of approximately 7 v–10 v.

12. A method of fabricating electrostatic discharge protection (ESDP) transistor elements for protecting internal transistor elements of an MOS IC device from electrostatic discharge dielectric breakdown voltages comprising:

defining active areas in a semiconductor material substrate separated by field oxide regions;

in active areas for ESDP transistor elements implanting source and drain regions of first type semiconductor material using a non-self-aligned transistor mask in a well of second type semiconductor material forming a channel between the source and drain regions;

depositing a passivating layer of low temperature deposited passivating material as a relatively thick oxide layer over the active area, said relatively thick oxide layer forming a relatively thick channel insulating passivating layer deposited over the active area between the channel and gate of the ESDP transistor element, providing the entire channel insulating layer between the channel and gate of ESDP transistor elements without thermally growing a channel insulating layer;

forming metal gates over the channels of ESDP transistor elements from a metal layer formed over the passivating layer;

fabricating the ESDP transistor elements with primary current paths coupled between an input or output of the MOS IC device and ground;

said channel insulating layer being deposited to a thickness providing for the ESDP transistor elements a turn on voltage $V_{TON}$ less than the dielectric breakdown voltage of internal transistor elements of the MOS IC device for diverting electrostatic charge buildup at an input or output to ground before occurrence of said dielectric breakdown voltage.

13. The method of fabricating ESDP transistor elements of claim 12 comprising using bond pads of an MOS IC device for the metal gates, and forming the bond pad metal gates over the respective ESDP transistor elements.

14. The method of fabricating ESDP transistor elements of claim 12 comprising fabricating NMOS ESDP transistor elements, and providing metal contact couplings between gate and drain regions of the NMOS ESDP transistor elements, and providing metal contacts from source regions to ground.

15. The method of fabricating ESDP transistor elements of claim 12 comprising depositing the relatively thick channel insulating passivating layer to a thickness in the range of approximately 5,000 Å to 6,500 Å and providing a threshold voltage $V_{TON}$ for the ESDP transistor element in the range of approximately 7 v–10 v.

16. The method of claim 12 comprising mask sequence steps for fabrication of an MOS IC device having internal MOS transistor elements fabricated in active areas of a semiconductor material substrate separated by field oxide regions, said method comprising mask sequence steps using IC mask means including a poly definition mask means, source/drain introduction mask means, contact definition mask means, and first metal layer (M1) definition mask means, said internal transistor elements incorporating a layer of polycrystalline semiconductor material, a passivating layer of low temperature deposited passivating material, and a first metal (M1) layer, said poly definition mask means being a gate definition mask for internal transistor elements defining gates of polycrystalline semiconductor material from the polycrystalline semiconductor material layer, said source/drain introduction mask means providing self aligned transistor mask means for the internal transistor elements defining source and drain of the internal transistor elements, said contact definition mask means defining an insulating passivating layer between the poly gate and M1 layer for internal transistor elements, and said M1 definition mask means defining conductor lines to the source and drain of internal transistor elements, said IC device having inputs and outputs with respective input and output bond pads for coupling to external circuitry, said mask means being modified according to the method as follows:

said mask means being constructed and configured for fabrication of at least one electrostatic discharge protection (ESDP) transistor element coupled to an input or output of the MOS IC device for diverting electrostatic charge buildup at a bond pad away from internal transistor elements to prevent dielectric breakdown of internal transistor elements, said ESDP transistor element having a source, drain, channel and gate fabricated in an active area of the semiconductor material substrate;

said poly definition mask means being constructed to cause etching of the polycrystalline semiconductor material layer across the active area of the ESDP transistor element for said ESDP transistor element to be formed without the polycrystalline semiconductor material layer in the active area of the ESDP transistor element;

said source/drain implant mask means being constructed to provide non-self aligned transistor mask means over the active area of the ESDP transistor element for introducing the source and drain separated by a channel through the non-self aligned transistor mask means;

said contact definition mask means being constructed to leave the said passivating layer over the active area of the ESDP transistor element without any intervening polycrystalline semiconductor material layer, said passivating layer being a relatively thick channel insulating layer deposited over the active area of the ESDP transistor element without thermally growing a gate insulating layer or channel insulating layer;

said M1 definition mask means being constructed for defining a metal gate over the channel of the respective ESDP transistor element, said ESDP transistor element to be formed with a metal gate comprising the M1 layer separated and insulated by the passivating layer from said channel, said M1 definition mask means being a gate definition mask for the ESDP transistor element.

17. The method of claim 16 wherein the M1 definition mask means is constructed so that the metal gate formed over the channel of the ESDP transistor element is a bond pad, said bond pad being positioned over the respective ESDP transistor element.

18. The method of claim 12 comprising mask sequence steps for fabricating an MOS integrated circuit (IC) device having internal MOS transistor elements fabricated in active areas of a semiconductor material substrate separated by field oxide regions said method comprising mask sequence steps using mask means including:

| | |
|---|---|
| 0 | P Well Definition Mask Means |
| 1.0 | Active Area Definition Mask Means |
| 2.0 | P Well Field Introduction Mask Means |
| 3.0 | Poly Definition Mask Means Providing [()Gate Definition Mask Means For Internal()] Transistors |
| 4.0 | N+ Source/Drain Introduction Mask Means Providing [()Self-Aligned Internal NMOS Transistor Mask Means()] |
| 4.1 | P− Source/Drain Introduction Mask Means Providing [()Self-Aligned Internal PMOS Transistor Mask Means()] |
| 5.0 | Contact Definition Mask Means |
| 6.0 | Metal 1 (M1) Definition Mask Means | said internal transistor elements incorporating a layer of polycrystalline semiconductor material, an insulating passivating layer of low temperature deposited passivating material, and a first metal (M1) layer, said 3.0 Poly Definition Mask Means being constructed to provide a gate definition mask means for internal transistor elements defining gates of polycrystalline semiconductor material from the polycrystalline semiconductor material layer, said 4.0 N+ Source/Drain Introduction Mask Means being constructed to define a self aligned transistor mask means for internal NMOS transistor elements for introduction around the polycrystalline semiconductor material gate of underlying source and drain regions separated by a channel, said 5.0 contact Definition Mask Means being constructed to define an insulating passivating layer between the polycrystalline semiconductor material gate and M1 layer for internal transistor elements, and said M1 Definition Mask Means being constructed to provide conductor lines to the source and drain regions of internal transistor elements, said mask means being constructed for fabricating the MOS IC device with inputs and outputs with respective input and output bond pads for coupling to external circuitry, said mask means being modified according to the method as follows:

said IC mask means also being constructed and configured for fabricating a plurality of said electrostatic discharge protection (ESDP) transistor elements coupled to respective inputs and outputs of the MOS IC device for diverting electrostatic charge buildup at the bond pads away from internal transistor elements to prevent dielectric breakdown of internal transistor elements, said ESDP transistor elements to be fabricated in active areas of the semiconductor material substrate;

said 3.0 Poly Definition Mask Means being constructed to provide an opening in the poly layer across the active areas of ESDP transistor elements for said ESDP transistor elements to be formed without the polycrystalline semiconductor material layer in the active areas of the ESDP transistor elements;

the 4.0 N+ Source/Drain Implant Mask Means being constructed to define a non-self aligned transistor mask means over the active areas of the ESDP transistor elements for introducing source and drain regions separated by channel regions through the non-self aligned transistor mask;

said contact definition mask means being constructed to leave said passivating layer over the active areas of the ESDP transistor elements without any intervening polycrystalline semiconductor material layer, said passivating layer being a channel insulating layer over the active areas of the ESDP transistor elements;

said 6.0 M1 Definition Mask Means being constructed to form metal gates from the M1 layer over the channel regions of the ESDP transistor elements, said ESDP transistor elements to be formed with said metal gates separated and insulated from the respective ESDP transistor element channel regions by the insulating passivating layer without thermally growing a gate insulating layer or channel insulating layer, said metal gates being bond pads of the MOS IC device overlying respective ESDP transistor elements, said 6.0 M1 Definition Mask Means being a gate definition mask for the ESDP transistor elements.

* * * * *